United States Patent
Rainal

[19]

[11] Patent Number: 5,864,089
[45] Date of Patent: Jan. 26, 1999

[54] LOW-CROSSTALK MODULAR ELECTRICAL CONNECTOR ASSEMBLY

[75] Inventor: Attilio Joseph Rainal, Morristown, N.J.

[73] Assignee: Lucent Technologies Inc., Murray Hill, N.J.

[21] Appl. No.: 970,233

[22] Filed: Nov. 14, 1997

Related U.S. Application Data

[63] Continuation of Ser. No. 491,013, Jun. 15, 1995, abandoned.

[51] Int. Cl.$^6$ ........................................................ H05K 9/00
[52] U.S. Cl. ............................................. 174/35 C; 439/941
[58] Field of Search ................................... 174/35 C, 268, 174/35 R; 333/1, 4, 5, 12; 439/620, 676, 941; 361/782, 766, 811, 763; 307/109

[56] References Cited

U.S. PATENT DOCUMENTS

| | | | |
|---|---|---|---|
| 5,326,284 | 7/1994 | Bohbot et al. | 439/676 |
| 5,341,419 | 8/1994 | Ferry | 379/417 |
| 5,513,065 | 4/1996 | Caveney et al. | 361/311 |

*Primary Examiner*—Bot L. Ledynh
*Assistant Examiner*—Kristina Soderquist

[57] ABSTRACT

A modular electrical connector assembly to which an electrical telecommunication cable is connectable for communicating electrical signals between the connector assembly and cable. The connector assembly includes an electrically nonconductive body and a crosstalk energy emitting electrical interference source on the body and/or on or proximate the connector assembly. Electrically conductive first and second leads on the body define an electrical signal circuit for carrying electrical signals communicatable with the cable. The first lead is located more closely proximate to the interference source than is the second lead such that a greater amount of crosstalk energy from the interference source is electromagnetically impressed on the first lead than on the second lead to thereby define a difference in crosstalk energy on the first and second leads. A parasitic sized RF chip capacitor connects the interference source to the second lead for transferring crosstalk energy therethrough in an amount sufficient to substantially equalize crosstalk energy on the first and second leads and thereby reduce crosstalk-induced interference in the electrical signal circuit. In this manner and existing Category 3 connector assembly (10 Mbs) is transformed into a Category 5 connector assembly (100 Mbs) for use with signal transmission by optical fiber to buildings and the like.

15 Claims, 4 Drawing Sheets

FIG. 4

LOW-CROSSTALK MODULAR ELECTRICAL CONNECTOR ASSEMBLY

This is a continuation, of application Ser. No. 08/491,013, filed Jun. 15, 1995 abandoned.

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention relates to a modular electrical connector assembly for transmitting signals between multi-channel telecommunication cables and, more particularly, to a connector assembly having a printed circuit wiring board in which capacitors are connected across or between predetermined pairs of traces having balanced interconnections to reduce crosstalk in the connector assembly at high data transfer rates.

BACKGROUND OF THE INVENTION

The capabilities of electronic telecommunication networks have expanded dramatically in recent years. The recent advances in telecommunication network technology are due in part to the increasing use of fiber optics as a data transmission medium in such networks. This has enabled transmission of data throughout the network at higher data rates—i.e. the product of the quantity and velocity of data carried through the network—than had heretofore been possible. Data rates of 100 Megabits per second (100 Mbs/sec) are now readily achievable whereas, before the advent of fiber optic transmission lines, data rates of 10 Mbs/sec were more typical. As a result, networks may utilize more advanced peripherals—such for example as the keyboard and video screen of a computer terminal, or a telephone—and other data processing devices which are more versatile and respond to or communicate a user's instructions at greater speeds.

Accordingly, it is desirable to use fiber optics as the data transmission medium in telecommunication networks to the greatest extent possible. One advantageous application of fiber optic telecommunication cable is the routing of signals or information between buildings—such for example as office buildings, retail establishments, warehouses, laboratories, manufacturing facilities and private homes—in which peripherals or other data processing devices are situated for data transmission between the data processing devices in the various buildings.

Fiber optic telecommunication cable normally cannot be connected directly to peripherals or other data processing devices unable to receive, process or output the optical signals carried by the fiber optics. The peripherals and other data processing devices usually receive and emit electrical signals via an electrical telecommunication cable. Thus, at least one converter—referred to herein as a "photo transceiver"—for transforming or converting an optical signal to an electrical signal, and vice versa, is usually provided at each junction between a fiber optic telecommunication cable and an electrical telecommunication cable which is, in turn, connected to at least one peripheral or other data processing device.

It is often preferable for the fiber optic cable to extend to a wiring closet in the building for connection to a photo transceiver situated therein. Branches defined by respective electrical telecommunication cables extend from the photo transceiver to the one or more peripherals or other data processing devices located in the building. A plurality of peripherals or other data processing devices may therefore use the same photo transceiver, thus limiting the required number of such transceivers which are typically expensive.

If a building has previously been wired with electrical telecommunication cable for peripherals or other data processing devices, such existing cable is preferably connected to a photo transceiver in a wiring closet within the building for connection to a fiber optic cable. The fiber optic cable may thus be connected to the peripherals or other data processing devices without having to install new electrical cable in, and to possibly remove the existing cable from, the building. Such an installation, whether or not in conjunction with the removal of existing cable, is normally a substantial undertaking since communications cables are typically routed through walls, floors, and ceilings and the like.

Whether or not previously installed, the electrical telecommunication cable routed throughout a building will ordinarily require electrical connectors to connect one end of the electrical cable to a respective peripheral or other data processing device and the opposite end of the cable to the photo transceiver. A conventional modular electrical connector may have a jack assembly including a printed circuit wiring board or substrate and is ordinarily mounted on an interior wall surface of the building. An electrical telecommunication cable may be fixedly connected to the jack assembly and extend into the interior of the wall, eventually terminating at another jack assembly to which the cable is also fixedly connected. The second jack assembly is typically mounted on another interior wall surface proximate the photo transceiver.

The jack assembly proximate the photo transceiver may receive a matching plug connected, in turn, to the transceiver. The other jack assembly may receive a matching plug connected to a peripheral or other data processing device which is thereby connected, via the electrical telecommunication cable and the electrical connectors, to the photo transceiver.

Unfortunately, undistorted data transmission through such electrical cables has proven difficult because of crosstalk produced within the electrical connectors. Such distortion is caused by electromagnetic fields that are created by current flow through the conductors within the connector and which cause electromagnetic coupling between the conductors. This electromagnetic coupling is amplified by the higher data rates made possible by the fiber optics—as for example 100 Mbs/sec—at which such crosstalk becomes unacceptable.

The crosstalk produced in conventional modular jack assemblies may be mitigated by lowering the data transfer rate therethrough. Such a procedure, however, diminishes or sacrifices major benefits—as for example the use of advanced peripherals and other data processing devices—made possible by the use of fiber optics. It is therefore desirable to maintain the increased data rate.

It is also desirable to limit or minimize changes to the structure of existing modular connector assemblies so as to allow continued use of the existing manufacturing capacity for the unchanged parts or components. It is further desirable for those components of the connector assemblies which physically interface or mate with other components of the telecommunication network—as, for example, the matching plugs that are connected to the peripherals and other data processing devices—to not be altered so that no changes to such other components of the network will be necessary.

SUMMARY OF THE INVENTION

According to one aspect of the present invention, a modular electrical connector assembly to which an electrical telecommunication cable is connectable for communicating electrical signals between the connector assembly and cable includes an electrically nonconductive body and a crosstalk energy-emitting electrical interference source on the body and/or on or proximate the connector assembly. Also present on the body are electrically conductive first and second leads in predeterminately spaced relation to one another and which define an electrical signal circuit for carrying electrical signals communicatable with the cable. The first lead is more closely proximate to the interference source than the second lead whereby a greater amount of crosstalk energy from the interference source is electromagnetically impressed on the first lead than on the second lead to thereby define a difference in crosstalk energy on the respective first and second leads.

The connector assembly further includes a coupling means for capacitively connecting the interference source to the second lead for transferring crosstalk energy between the interference source and the second lead through the coupling means in an amount sufficient to substantially eliminate the difference in crosstalk energy on the first and second leads. Crosstalk in the connector assembly at high data rates is thereby effectively reduced. The coupling means may be implemented by one or more capacitors of predetermined value.

In a further aspect and implementation of the present invention, the body comprises a dielectric or insulating substrate and the first and second leads are defined by printed circuit traces configured to have balanced interconnections so as to further reduce crosstalk in the connector assembly. Crosstalk in known modular electrical connector assemblies may be advantageously reduced by simply replacing the printed circuit wiring board of such known assemblies with the printed circuit wiring board of the present invention without further changes in or modifications to the known connector assemblies.

The various features of novelty which characterize the invention are pointed out with particularity in the claims annexed to and forming a part of this disclosure. For a better understanding of the invention, its operating advantages, and specific objects attained by its use, reference should be made to the following detailed description in conjunction with the accompanying drawings in which there are illustrated and described currently preferred embodiments of the invention. It is to be understood, however, that the following detailed description and drawings are not intended to define the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE PREFERRED EMBODIMENTS

Figure 1:
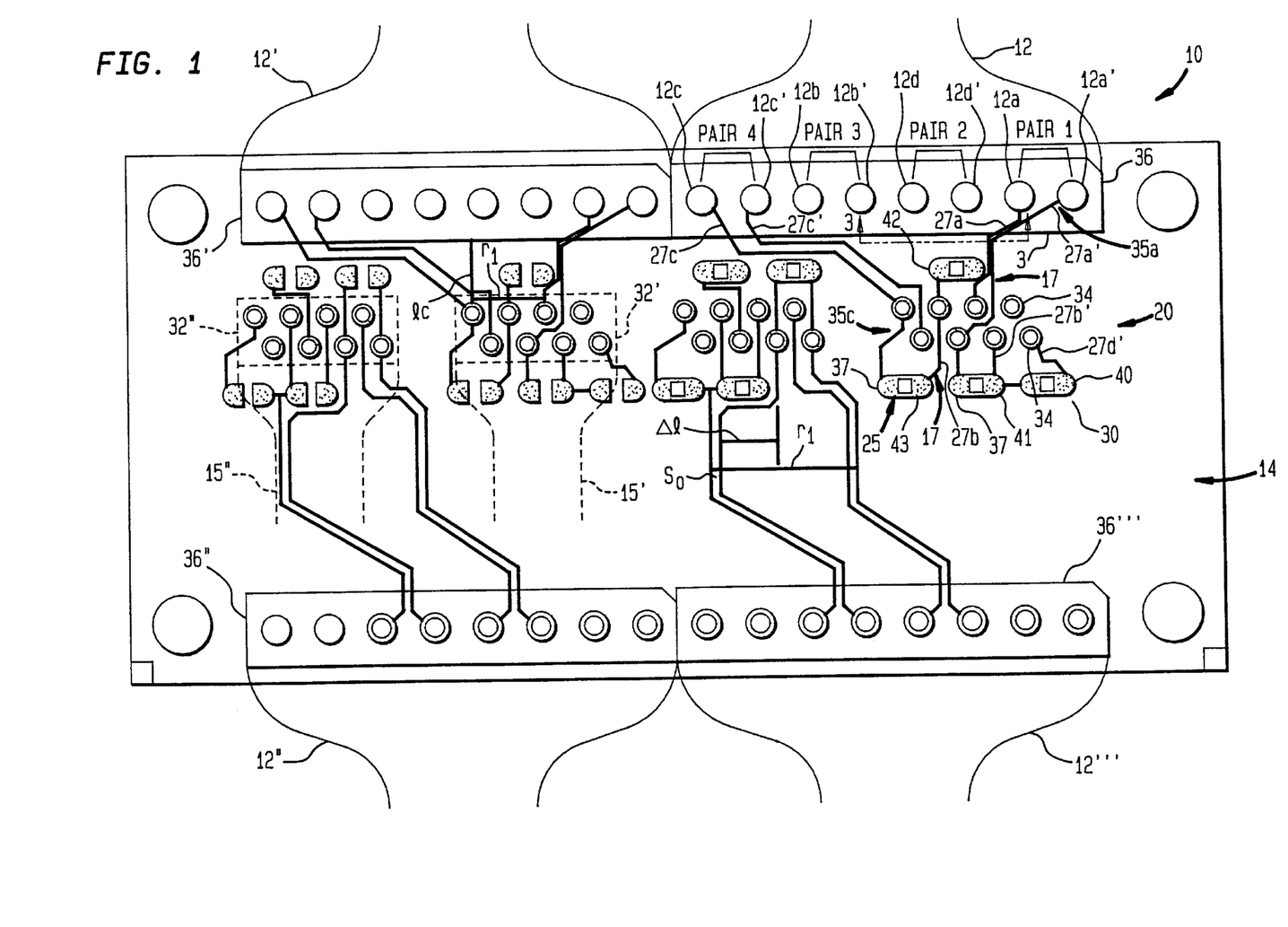
FIG. 1 is a top plan view of a modular electrical connector assembly constructed in accordance with the present invention and incorporating four substantially identical embodiments of the invention.

With reference now to the drawings, FIG. 1 illustrates the printed circuit board or substrate of a modular electrical connector assembly for reducing crosstalk that is constructed in accordance with the teachings of the present invention and identified by the general reference number 10.

Figure 2:
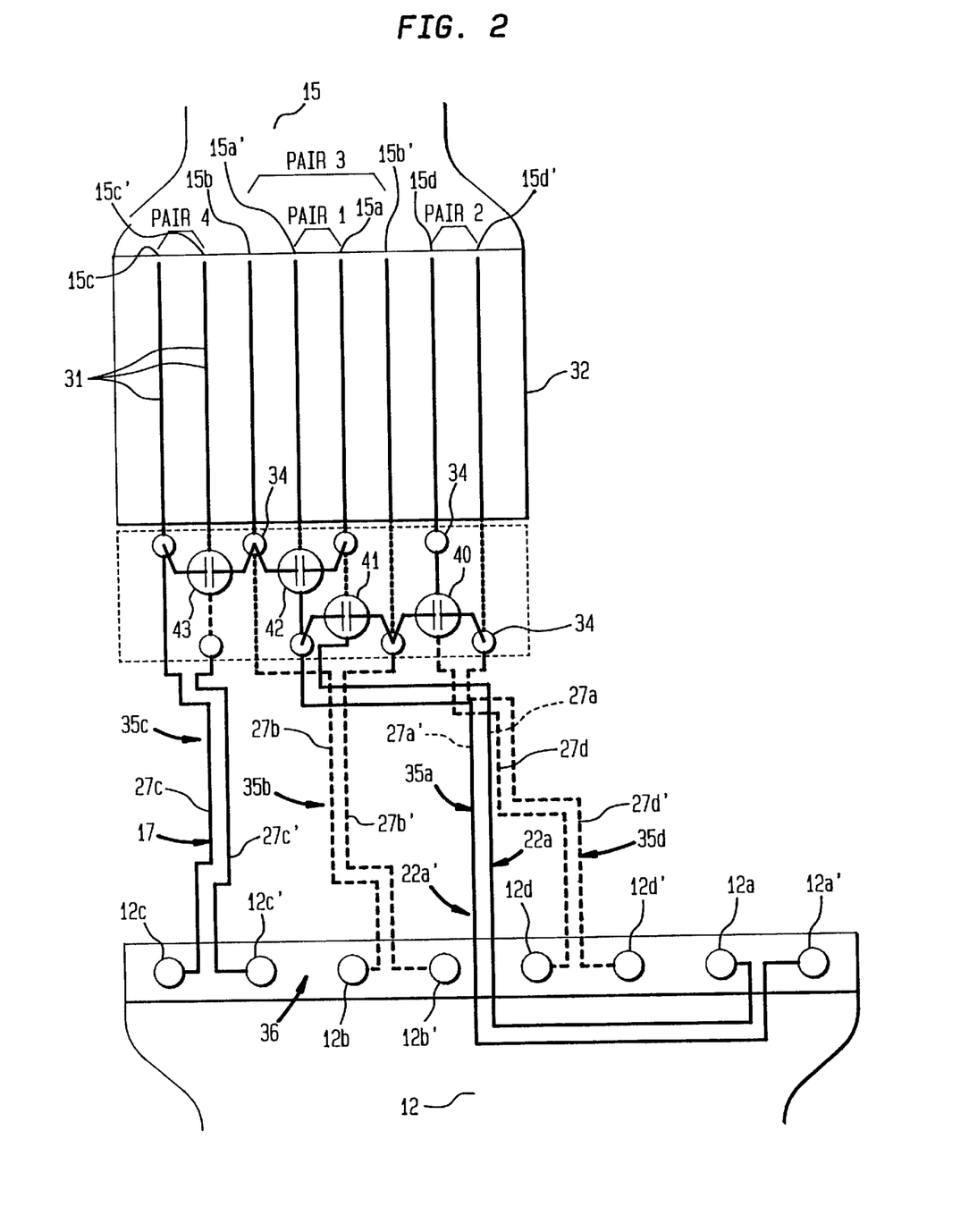
FIG. 2 is a schematic diagram of and including the rightmost pad portion of FIG. 1, showing the traces which are capacitively connected.

The modular connector assembly 10 of the invention is generally intended for use in passing or transmitting signals between respective first and second electrical telecommunication cables 12 and 15, each of which has at least one pair of conductors spaced apart from a like pair of the other cable such, for example, as the respective cable pairs delineated 12a, 12a' of cable 12 and 15a, 15a' of cable 15 in FIGS. 1 and 2. For convenience of description, each of the pairs 12a, 12a' and 15a, 15a' is referred to herein as "PAIR 1". When connected in end-to-end relation through the connector assembly, the pairs 12a, 12a' and 15a, 15a' define the two conductive lines or wires or paths of a first electrical signal circuit 35a. Thus, with the cables 12, 15 connected to and through the connector assembly 10, conductors 12a, 15a define the respective opposite end points of one conductive path and conductors 12a', 15a' define the respective opposite end points of the second conductive path which together form the signal circuit 35a. Of course, each cable 12, 15 may, and typically will, have more than a single pair of conductors—as for example illustrated in FIG. 1 wherein each cable includes four pairs of conductors respectively identified as "PAIR 1", "PAIR 2", "PAIR 3" and "PAIR 4"—to simultaneously carry the signals of four separate or associated channels or circuits.

The connector assembly 10 may accordingly provide conductive paths for interconnecting multiple pairs of cables through the assembly 10. The embodiment illustrated in FIG. 1, for example, enables communication between four pairs of first and second cables 12 and 15, 12' and 15', 12" and 15", and 12'" and 15'", each of which cables includes four pairs of conductors; for convenience of illustration, however, only cable 15 of the second cables 15, 15' 15" and 15'" is shown in the drawings. Thus, and as illustrated in FIG. 1, each first cable 12, 12', 12", 12'" is connected to a respective "110 Connecting Block" 36, 36', 36", 36'" or the like that is carried on the body or printed circuit board or substrate 20 of the connector assembly 10. Similarly, each second cable 15, 15', 15", 15'" is connected to a respective conventional RJ-45 modular jack 32, 32', 32", 32'" or the like that is affixed to or otherwise associated with the surface of the body 20.

Substantially identical arrangements of elements provide electrically conductive pathways between the respective conductive pairs of the various first and second cables for communication of signals therebetween. To avoid unnecessary repetition, only that portion of the connector assembly 10 which provides electrical communication between the two cables 12 and 15 is described in detail hereinbelow; those skilled in the art will readily comprehend the like connection of the other respective pairs of first and second cables such, for example, as the first and second cables 12', 15'. For additional convenience, each of the cable conductors—12a–d, 12a'–d', 15a–d and 15a'–d'—is identified herein by a reference numeral convention formed by the conductor's numeric cable identifier (i.e. 12 or 15), a letter designating the signal circuit of which the conductor forms a part (e.g. an "a" for the signal current 35a) and, where appropriate, an apostrophe or "prime" delineator to indicate a second conductive lead or leg or wire of the signal circuit—each circuit being formed of a pair of conductors. For example, conductors 12a, 15a of the respective cables 12, 15 are connected through the electrical connector assembly 10 to define one electrically conductive path or lead of the first signal circuit 35a, and conductors 12a', 15a' of the cables 12, 15 are similarly connected through the assembly 10 to define the other electrically conductive path of the first signal circuit 35a.

Cable 12 will typically extend in or through a building structure—as for example through walls, ceilings and floors—to a wiring closet for connection to a telecommunication network. Cable 15, on the other hand, is generally contemplated as being of the type that connects a peripheral or other data processing device located the building, to a substrate outlet, as such as the connector assembly 10.

The cables 12, 15 may, by way of example, comprise one or more Category 3 or 5 unshielded twisted pair (UTP) cables, which are capable of carrying data at rates of as high as 10 Mbs/sec and 100 Mbs/sec, respectively, with acceptable levels of signal distortion. Those skilled in the art will readily appreciate that the crosstalk reduction provided by the connector assembly 10 of the present invention renders the assembly 10 particularly well-suited for electrically connecting runs of Category 5 UTP cable since the typically high data rates carried by such cables may produce unacceptably high levels of crosstalk in conventional electrical connectors. Cables of this type are themselves specifically constructed so as to minimize crosstalk energy and, accordingly, may ordinarily be substantially disregarded as a potential interference source 17.

The currently preferred and herein-described form of modular electrical connector assembly 10 thus comprises an electrically nonconductive body 20, and first and second electrically conductive leads 22a, 22a' (FIG. 2) carried on the body 20 and spaced from one another for connecting respective sides or legs or paths of the conductor pairs—e.g. 12a to 15a and 12a' to 15a' —of the cables 12, 15 to define the first signal circuit 35a.

In this preferred embodiment depicted in FIGS. 1 and 2, the first and second leads 22a, 22a' are in the form of electrically conductive first and second printed circuit traces 27a, 27a' comprising copper material deposited or otherwise formed on a generally flat primary surface 30 of an electrically nonconductive substrate 14. The substrate 14 is preferably formed of FR4 epoxy glass although other materials may alternatively be employed as a matter of design choice. The preferred FR4 epoxy glass includes an epoxy lamina having an internal layer of woven glass fibers disposed generally parallel to the sides or faces of the lamina. The spaced apart first and second traces 27a, 27a' thus define the first signal circuit 35a. The term "trace pair", as used herein, identifies a pair of traces which together define a single signal circuit.

Also shown as deposited on the primary substrate surface 30 of the illustrated embodiment is an additional copper-defined trace pair 27c, 27c' for interconnecting another predetermined pair of conductors of each of the first and second cables 12, 15. The substrate 14 further includes a generally flat secondary surface 33 opposite and generally parallel to the primary surface 30; copper traces 27b, 27b' and 27d, 27d' are deposited on this secondary surface 33 for interconnecting other predetermined pairs of conductors of the first and second cables 12, 15.

Thus, each of the traces 27a, 27a', 27c, 27c' on the primary surface 30 and the traces 27b, 27b', 27d, 27d' on the secondary surface 33 is connected to a predetermined conductor of cable 12 through the 110 Connecting Block 36 on the substrate 14, as for example shown in FIGS. 1 and 2.

Each trace 27a–d and 27a'–d' also extends from the connecting block 36 and is connected, at its opposite end, to a respective pin 34 formed of conductive metal, preferably a highly conductive core encased by a strong protective shell and secured to the substrate 14. The pins 34, in turn, are connected to respective conductive jack leads 31 of the modular jack 32 that is attached to or associated with the secondary surface 33. The type RJ-45 or the like modular jack 32 is conventionally configured to accommodate electronically-communicating access to the leads 31 by a corresponding, releasably engageable modular plug (not shown) which depends from the cable 15 and includes a respective fixed lead for each such jack lead 31. When the modular plug and modular jack 32 interengagingly mate, as by insertion of the modular plug into the jack, predetermined pairs of the jack leads 31 and of the modular plug leads are brought into contact with one another to electrically connect each conductor in the cable 15, via a respective pin 34, to one of the traces 27a–d and 27a'–d'.

The pins 34 also provide an electrical connection and communication path between traces carried on the primary and secondary surfaces 30, 33. For example, pins 34 connect respective portions of each of the traces 27b, 27b', 27d, 27d' on the primary and secondary surfaces 30, 33 of the substrate.

Interference Sources

The connector assembly 10 includes at least one electrical interference source 17 that, undesirably, emits crosstalk energy from the body 20 proximate at least one pair of leads 22a, 22a' which, in the embodiment depicted in FIGS. 1 and 2, may be any of the trace pairs. When the traces (e.g. 27a, 27a') are differently or asymmetrically spaced from the interference source 17, as is typical, one trace (27a) receives via electromagnetic coupling a larger portion of the crosstalk energy emitted by the interference source than that received via electromagnetic coupling by the other trace (27a') of the pair. Receipt of unequal amounts of crosstalk energy by the trace pair 27a, 27a' ordinarily causes distortion of electrical signals carried by the first signal circuit 35a, defined by the trace pair 27a, 27a'.

Because of the close proximity of the traces 27a–d and 27a'–d' to one another on the substrate 14, and the relatively high data rates permitted by fiber optics, as for example 100 Mbs/sec, each signal-carrying trace may effectively function as an antenna that both broadcasts crosstalk energy to and receives crosstalk energy from one or more of the adjacent traces. Thus, the traces 27a–d and 27a'–d' not only provide individual electrically-conductive signal pathways between the cables 12, 15 but, are in addition, themselves electrical interference sources 17 that emit crosstalk energy. Moreover, the RJ-45 jack leads 31 and the terminals of the 110 Connecting Block 36 to which the conductors 12a–b and 12a'–b' are connected—which carry signals at the same high data rates as do the traces 27a–d and 27a'–d'—are located sufficiently proximate those traces to define electrical interference sources 17 in the same manner as do the traces themselves. Thus, references herein to the body as carrying or incorporating the interference source should and are intended to be understood as broadly encompassing the connector assembly in general—including, for example, the jack leads 31 and the terminals of the Connecting Block 36 which, as noted, are often also sources of electromagnetically-transferred crosstalk energy.

As previously noted, the traces are so disposed and configured on the substrate surface 30 that each trace pair which defines a signal circuit is asymmetrically located relative to the other adjacent trace pairs in the plane of the surface 30. As a result, the distances between the traces of each trace pair defining a signal circuit and the other adjacent traces on the substrate surface are not equal.

If each such other adjacent trace is considered an electrical interference source—which as pointed out hereinabove is realistic at high data rates—the unequal distances between the trace pair defining the signal circuit and the other adjacent traces result in the trace located more closely proximate the interference source 17 receiving a greater amount of the crosstalk energy from the source 17 than the amount received by the other trace of the pair. This results in distortion of the electrical signal carried by the signal circuit 35 that receives the crosstalk energy.

It will be appreciated that unintended interference sources other than and/or in addition to the particular traces thus far discussed may also be affixed to or carried on or disposed proximate the substrate 14 and thereby impart crosstalk interference onto the signal circuit(s). For example, the modular jack 32 may itself emit crosstalk energy asymmetrically with respect to one or more of the trace pairs 27a–d, 27a'–d' so that the individual traces of such trace pairs receive unequal amounts of crosstalk energy, thus distorting data carried by the signal circuits defined by the affected trace pairs. Similarly, the 110 Connecting Block 36 may also emit crosstalk energy asymmetrically with respect to one or more of the trace pairs 27a–d, 27a'–d', further distorting the signals carried by the conductive trace pairs.

Capacitive Connections

In accordance with the present invention, signal distortion electromagnetically impressed on a signal circuit from an interference source 17, by virtue of the unequal distances between the individual traces (or other leads) of the signal circuit and the interference source, may be significantly reduced by capacitively coupling or connecting the interference source to the more distant (from the interference source) of the two traces of the signal circuit. This capacitive connection operatively compensates for the uneven or unbalanced electromagnetic impression of crosstalk energy from the interference source to the individual traces of the signal circuit by supplying additional crosstalk energy from the interference source, through a capacitive element or means 25, to the trace which is more distant or spaced or separated from the interference source and which accordingly receives less crosstalk energy via electromagnetic coupling. By providing such a bridging capacitance in accordance with the present invention, the two traces of the signal circuit receive substantially equal amounts of crosstalk energy from the interference source in that the voltage change produced by the transfer of crosstalk energy is substantially equalized in the two traces. Since the signal carried by the signal circuit is typically defined by the relative voltage difference between the traces thereof, the signal being carried by the circuit is in effect unchanged by the crosstalk energy emitted by the interference source.

It will be appreciated that the operating advantages provided by the connector assembly 10 of the present invention will be fully realized, even if used to connect cables 12, 15 carrying as few as a single active pair of conductors, where the assembly 10 additionally includes or has associated therewith or is situated in electromagnetically-significant proximity to an electrical interference source other than other traces or trace pairs carrying high speed electrical signals between the two interconnected cables.

The capacitive means 25 in the herein-disclosed embodiment of FIGS. 1 and 2 is implemented as a plurality of parasitic chip capacitors 40, 41, 42, 43, each soldered or otherwise affixed to a respective capacitor pad 37 on one of the substrate surfaces integral with a respective trace to which it is electrically connected. A tin alloy may be used to solder the chip capacitors 40–43 to the respective capacitor pads 37, although other suitable solder or affixation materials are also within the intended scope of the invention.

The chip capacitors 40–43 are preferably ultra high Q porcelain, RF and microwave surface mount chip capacitors with a porcelain dielectric material. In the currently preferred embodiment of FIGS. 1 and 2, each chip capacitors 40, 41, 42 has a capacitance of approximately 1.7 picofarads (pF), and capacitor 43 has a capacitance of approximately 1.2 pF, with an acceptable tolerance of approximately ±0.1 pF. Capacitors of this type are available, by way of example, from Dielectric Laboratories Inc. of Cazenovia, N.Y. as part no. C11AH1R3B5SXL. Those skilled in the art will in any event recognize and appreciate that one or more of the chip capacitors 40–43 may optionally be replaced by any functionally equivalent structure exhibiting a suitable capacitance and situated connectingly between the opposed portions of a pad 37 or the respective pins 34.

The capacitor pads 37 are perhaps best seen in the two leftmost printed circuit regions depicted in FIG. 1 in which the capacitors have been omitted for clarity and ease of description. The pads 37 are preferably located as close to the pins 34 as manufacturing considerations permit to minimize the distance between the chip capacitors 40–43 and modular jack 32 since, in the embodiment depicted in FIGS. 1 and 2, crosstalk produced by the modular jack is mitigated predominantly by the chip capacitors.

Each chip capacitor (e.g. 42) operatively compensates for the effect of a respective trace (e.g. 27b) or other interference source on those traces (e.g. 27a', 27a) of an adjacent signal circuit (e.g. 35a) that is most affected by crosstalk emissions from that interference source. The parasitic nature of the chip capacitors 40–43—such capacitors draw relatively small amounts of charge from the traces to which they are connected—reduces any distortion in the signal circuit defined by the source or interference-originating trace from which the crosstalk energy is transferred, via the chip capacitor, to the trace of an adjacent signal circuit. The relatively insignificant distortion produced by each chip capacitor in the connected signal circuit from which the crosstalk energy is emitted readily permits more than one capacitor to be coupled to a single trace.

It will be appreciated by those skilled in the art that the particular traces that are capacitively coupled in accordance with the invention will differ from one connecter structure to another as a function of the relative locations of the electrical interference source(s) and the signal-carrying trace pair(s) as will the appropriate values of the connecting capacitance.

As will also be apparent, distortion resulting from crosstalk emissions emitted from the modular jack 32 may likewise be reduced in accordance with the invention by capacitively coupling that portion of the modular jack—e.g. one or more of the leads 31—from which the crosstalk energy originates to that trace of the affected pair which is more distant or spaced from the energy-emitting modular jack lead.

Similarly, distortion produced by crosstalk energy emissions from the 110 Connecting Block 36 may be reduced by capacitively coupling the relatively more distant trace of the affected pair (which receives the lesser amount of crosstalk energy) to that portion or terminal(s) of the 110 Connecting Block from which the crosstalk energy is emitted.

The chip capacitors 40–43 and the chip pads 37 in the connector embodiment depicted in FIG. 1 are all on the primary surface 30 of the substrate. The electrically conductive paths between the primary and secondary surfaces 30, 33, as provided by the pins 34, enable ready connection of traces located on the secondary substrate surface to the chip capacitors mounted on the primary surface. Those skilled in the art will nevertheless recognize that other and different ones of combinations of the traces and/or capacitors may be located on or distributed between the primary and secondary substrate surfaces as general matters of design choice.

Balanced Interconnections

Distortion of signals in the signal circuits 35 that is caused by emission from and receipt by the various signal traces of unequal amounts of crosstalk energy—i.e. due to crosstalk between or among the plural signal circuits—may be further reduced by forming the traces with balanced interconnections. Balanced interconnections result from the configuration of the traces on the primary and secondary surfaces 30, 33, in particular, from the size of the trace cross sections, the distances between traces in the plane of each of the primary and secondary substrate surfaces 30, 33, and the thickness of the substrate 14 (i.e. the spacing between the opposite surfaces 30, 33).

The most preferred manner of providing balanced interconnections of the traces on the substrate 14 is to first define a trace configuration, including the cross section of the traces, in which the distance between the individual traces of each trace pair in the planes of the primary and secondary surfaces 30, 33 is minimized so as to reduce noise pickup, as by field cancellations resulting from opposite current flow in the trace pair. However, in practice the ability to minimize the gap between the traces of each trace pair is generally limited by conventional manufacturing processes which are typically not suited for fabricating a trace pair consisting of closely-spaced traces. It is also preferable to maximize the distance between respective trace pairs in the planes of the primary and secondary surfaces 30, 33 so as to limit electromagnetic coupling therebetween.

The thickness of the substrate 14 is generally determined by such considerations as cost and mechanical strength, although it is most preferred for the substrate to have a thickness of approximately 62 mils (1 mil=0.001 inch) which is currently a relatively standard thickness for commercially available circuit board substrates produced in bulk quantities.

When a specific trace configuration and substrate thickness has been established, compliance with the relations defined by the below-identified Equations (1), (2) and (3), is verified using certain dimensions of the established trace configuration and substrate thickness. Equations (1), (2) and (3) may be found in A. J. Rainal, "Transmission Properties of Balanced Interconnections", 16 IEEE Transactions on Components, Hybrids, and Manufacturing Technology 137–145 (Febuary 1993), the entire disclosure of which is expressly incorporated by reference herein. When Equations (1), (2) and (3) are satisfied, then the specified trace configuration has balanced interconnections.

While it is most preferred that all of the traces on the subject substrate be sized and located in accordance with the constraints of Equations (1), (2) and (3), it is nevertheless within the intended scope and contemplation of the invention that fewer than all of the traces, and/or only portions of the traces, satisfy Equations (1), (2) and (3).

The variables W. $t_0$, $s_0$, r, h, and $\Delta$ in Equations (1), (2) and (3) represent the various spacings and dimensions, in inches, that are pictorially identified in FIG. 3. Thus, the variable W represents the width and the variable $t_0$ the thickness of the cross section of the traces. In the embodiment of the invention illustrated in FIGS. 1 and 2, W and $t_0$ most preferably equal approximately 10 mils and 1.4 mils, respectively.

The variable p represents the perimeter of the cross section of the traces and is defined by the equation $$p=2(W+t_0).$$

In the preferred embodiment of the invention all of the traces, except for the capacitor pads (e.g. 37 in FIG. 1), have generally the same constant cross sectional dimension throughout their lengths.

Figure 3:
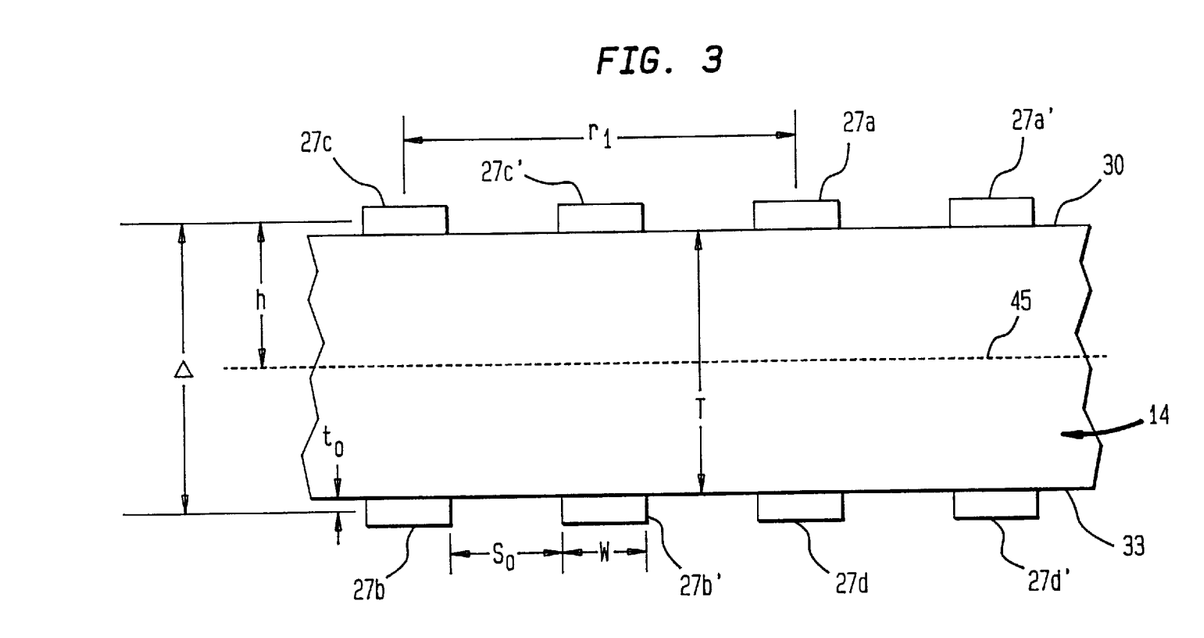
FIG. 3 is a cross sectional view taken along the lines 3—3 in FIG. 1 with some parts removed and showing the dimensional relationships used for calculating the impedance and near-end crosstalk voltage ratios for traces of substantially rectangular cross section.

The variable $s_0$ identifies the edge-to-edge spacing between each trace pair, an example of which is shown in each of FIGS. 1 and 3. In the illustrated embodiment, $s_0$ most preferably equals approximately 10 mils.

The variable $r_0$ represents the center-to-center spacing between each trace pair and is defined by the equation $$r_0=W+s_0.$$

The variable $r_1$ identifies the lateral center-to-center spacing between adjacent trace pairs, an example of which is shown in each of FIGS. 1 and 3.

The variable $\Delta$ represents the distance between the centers of the traces formed on the primary and secondary surfaces 30, 33 of the substrate (see FIG. 3). In the embodiment in FIGS. 1 and 2, $\Delta$ most preferably equals approximately 63.4 mils. The thickness of the substrate therefore equals the variable $\Delta$ minus the thickness $t_0$ of the trace cross section.

The variable h in Equations (1), (2) and (3) identifies the distance between the trace center and a ground plane, a typical location of which is shown by the broken line 45 in FIG. 3. In the embodiments of the invention herein disclosed, however, the substrate 14 does not include an internal conductive layer and therefore lacks a ground plane. In such cases—i.e. where no ground plane is present—h is taken to be infinity because a ground plane at an infinite distance from the traces would have approximately the same effect on crosstalk received by the traces as if no ground plane were present in the substrate.

Equations (1), (2) and (3) nevertheless accurately indicate whether a specified trace configuration on a substrate 14 has balanced interconnections by making h large. If h is set to "20", for example, Equations (1), (2) and (3) are sufficiently accurate for most purposes without making the required calculations unwieldy (which could happen if a far larger value were used for h) or impossible (if "infinity"was substituted for h). In any event, the variable d in Equations (1), (2) and (3) is defined by the equation $$d=2h.$$

It will be appreciated by those skilled in the art that less crosstalk in electromagnetically impressed on the traces when the substrate incorporates a ground plane—i.e. a conductive layer—than when no ground plane is present. The ground plane effectively shields the traces from crosstalk energy by attracting and absorbing such energy by virtue electrical conductivity of the of the ground plane. A ground plane, however, may also have disadvantages—for example, the inclusion of a conductive layer in the substrate ordinarily increases its cost—which outweigh the advantages resulting from its shielding effect. The provision of a ground plane, therefore, may or may not be warranted in any particular printed wiring board or application.

The complexity of Equations (1), (2) and (3) may be reduced by assuming that the length of each trace is infinite. Such an assumption does not materially affect the ability of Equations (1), (2) and (3) to accurately determine whether a particular trace configuration has balanced interconnections; crosstalk is ordinarily higher in longer, as compared to shorter, traces because the longer traces have a larger surface area over which to receive crosstalk energy. Crosstalk levels are a reliable indicator of the presence of balanced interconnections since crosstalk levels normally remain below an upper limit with balanced interconnections. Thus, if Equations (1), (2) and (3) indicate that a specified trace configuration has balanced interconnections when the traces are assumed to have infinite lengths, then the actual printed wiring board will likewise have balanced interconnections since the lengths of the traces in an actual wiring board are also less than infinite.

Figure 4:
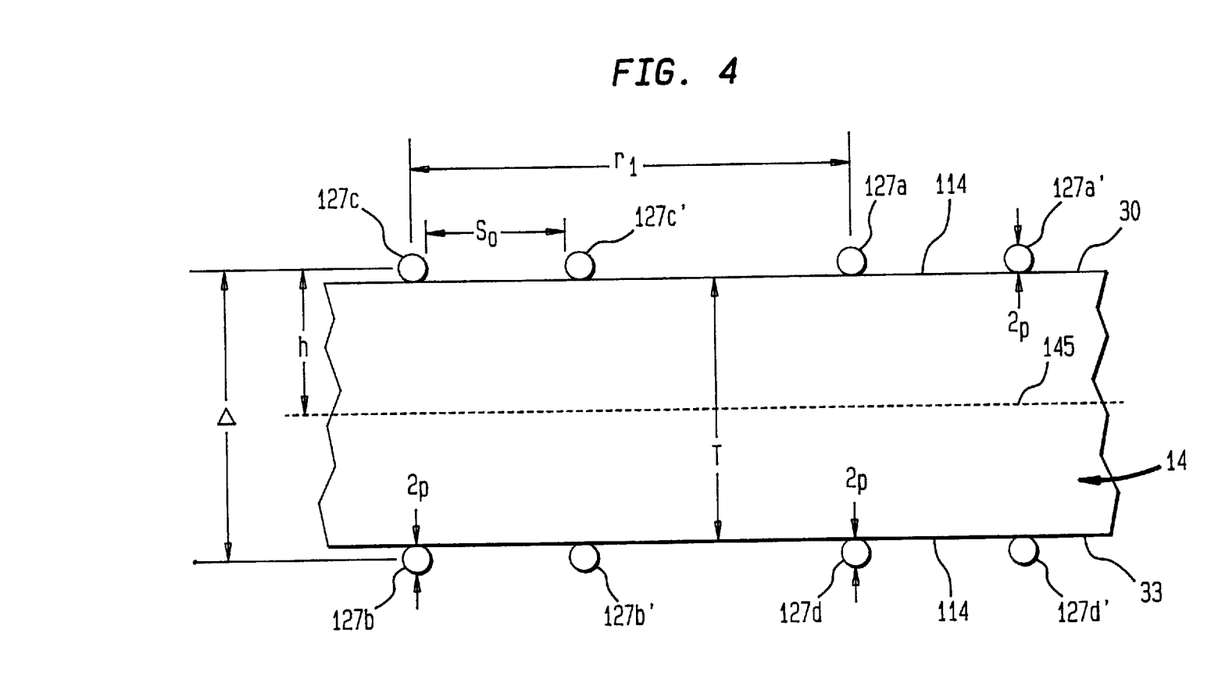
FIG. 4 is a cross sectional view similar to FIG. 3 of an alternative embodiment of a modular electrical connector assembly employing traces of substantially circular cross section.

FIG. 4 is a cross sectional view, similar to FIG. 3, of an alternative embodiment of the invention in which the traces $127a$–$d$, $127a'$–$d'$ have circular (rather than rectangular) cross sections with a radius $\rho$. Elements in FIG. 4 that similarly correspond to those depicted in FIGS. 1, 2 and 3 have like reference numerals with the addition (in FIG. 4) of the prefix 100.

Equations (1), (2) and (3) may be employed to determine whether a configuration of traces having circular cross sections has balanced interconnections by modifying Equations (1), (2) and (3) in the following manner. For traces having circular cross sections, the variable p is defined by the equation $$\rho = 2pe^{[5/4]}.$$

The variable $r_0$, which represents the center-to-center spacing between each trace pair, is defined by the equation $$r_0 = 2\rho + s_0$$

for traces having circular cross sections. The variable $\Delta$ in this case equals the thickness of the substrate plus twice the trace radius $\rho$.

Equation (1) sets forth a first of the tests for determining whether a specified trace configuration has balanced interconnections. Equation (1) indicates that for balanced interconnections the impedance of a trace pair, expressed as a function of the cross sectional size of the traces and certain dimensions of the trace pair configuration, is approximately equal to—i.e. within ±10% of—the impedance, represented by the variable $Z_B$(in $\Omega$), of the pairs of conductors in the cables leading to and from the respective trace pairs. The impedance $Z_B$ of the conductor pairs in either cable may ordinarily be used since the conductor impedances in each cable are normally substantially equal. In the embodiment of the invention illustrated in FIGS. 1 and 2, $Z_B$ most preferably equals approximately 100 $\Omega$.

When evaluating a trace configuration using Equation (1), $s_0$ is the minimum side-to-side spacing between the respective traces of the pair. The minimum spacing $s_0$ is ordinarily the same for each trace pair since the conductors defining the respective signal circuits are typically substantially identical and therefore have approximately the same impedance $Z_B$. If the conductor pairs have different impedances $Z_B$ and/or the distance $s_0$ differs among the various trace pairs, then each different combination of distance $s_0$ and impedance $Z_B$ should be checked for compliance with Equation (1). The variable $\epsilon_r$ in Equation (1) represents the dielectric constant of the substrate material which, in the disclosed embodiment, most preferably equals approximately 4.2.

Equation (1) is:

$$0.9 Z_B \leq \frac{120}{1.016 \sqrt{\epsilon_r}} \ln \left[ \frac{2e^{3/2}d}{p[1 + (d/r_0)^2]^{1/2}} \right] \leq 1.1 Z_B \qquad \text{Eq. (1)}$$

Those skilled in the art will appreciate that it is often difficult, if not impossible, to form the trace pairs such that the side-to-side trace spacing $s_0$ is constant throughout the entire length of the pair. Increases in the side-to-side spacing $s_0$ are commonly required at the ends of the traces, as for example, illustrated in FIG. 1 at the junctions between the traces $27a$–$d$, $27a'$–$d'$ and the "110 Connecting Block" 36 and pins 34.

Whether or not a particular increase in the trace-to-trace spacing $s_0$ of a pair introduces significant signal reflection can be determined from the following Equations (A) and (B). If Equations (A) and (B) are satisfied, then the signal reflection caused by the increase in the spacing $s_0$ is negligible.

Equation (A) is:

$$\frac{2T_D \Delta l}{t_r} \leq 0.1 \qquad \text{Eq. (A)}$$

The variable $\Delta l$ in Equation (A) represents the trace length having the side-to-side trace spacing $s_0$ as for example shown in FIG. 1. The variable $t_r$ in Equation (A) identifies the smallest rise time for the trace pair being evaluated. If, for example, the trace pair will carry a maximum data rate of 100 Mbs/sec, then $t_r$ in Equation (2) equals about 2 nanoseconds (ns).

The variable $T_D$ in Equation (A) is defined by Equation (B), as follows:

Equation (B) is:

$$T_D = \frac{1.016}{12} \sqrt{\epsilon_r} \text{ ns/in} \qquad \text{Eq. (B)}$$

The variable $\epsilon_r$ in Equation (B) represents the dielectric constant of the substrate material.

Equation (B) may be found in A. J. Rainal, "Transmission Properties of Balanced Interconnections", 16 IEEE Transactions on Components, Hybrids, and Manufacturing Technology 137–45 (1993).

Equation (2) sets forth the second of the tests for determining whether a specified trace configuration has balanced interconnections. Equation (2) indicates that for balanced interconnections the near-end crosstalk voltage ratio (NEXT) of the trace pair, expressed as a function of the cross sectional size of the traces and certain dimensions of the trace pair configuration, is no greater than a predetermined value represented by the variable BB. In the embodiment illustrated in FIGS. 1 and 2, BB most preferably equals approximately 0.01.

When evaluating a trace configuration using Equation (2), $r_1$ is the minimum lateral spacing between adjacent pairs of traces.

Equation (2) is:

$$\frac{\ln\left(\frac{[1+[d/(r_1+r_0)]^2][1+[d/(r_1-r_0)]^2]}{[1+(d/(r_1)^2]^2}\right)}{8\ln[9(d/p)/[1+(d/r_0)^2]^{1/2}]} \leq BB \qquad \text{Eq. 2}$$

Those skilled in the art will appreciate that it is often difficult, if not impossible, to form the trace pairs so that a center-to-center spacing $r_1$ sufficiently large to satisfy Equation (2) is maintained throughout the entire length of each pair, particularly in the vicinity of the pins 34, such as illustrated in FIG. 1.

Where two adjacent trace pairs are configured such that the minimum center-to-center spacing $r_1$ does not satisfy Equation (2), then the calculated ratio in Equation (2) which is compared to BB may be multiplied by the variable BB' as defined by the following Equation (C), and the comparison with BB defined by Equation (2) then repeated. If the product of the calculated ratio and the multiplier BB' is less than BB, then those portions of the trace pairs separated by more than the minimum center-to-center spacing $r_1$ do not prevent the trace pairs from having balanced interconnections.

Equation (C) is:

$$BB' = \frac{2T_D l_c}{t_r} \qquad \text{Eq. (C)}$$

In Equation (C), the variable $l_c$ represents the trace pair lengths that are separated by the center-to-center spacing $r_1$ being evaluated.

Thus, in accordance with the invention, each trace pair having (for example) end portions with increased spacing between the traces is tested using Equation (2), preferably by starting with that trace pair where traces are further separated by the least added distance. Then, the next largest center-to-center spacing $r_1$ between the trace pairs may be checked for compliance with Equation (2), and if not in compliance, the comparison repeated using the multiplier BB' as described above. These comparisons may be repeated for portions of the trace pairs separated by successively larger center-to-center spacings $r_1$ until a spacing $r_1$ is found which either (i) does not satisfy Equation (2), even when the multiplier BB' is used, thereby indicating that the increased-separation portions of the trace pair being evaluated precludes balanced interconnections, or (ii) a center-to-center spacing $r_1$ is found which satisfies Equation (2) without the multiplier BB'; thereby indicating that the portions of the trace pair being evaluated as well as the unevaluated portions do not preclude balanced interconnections.

If the center-to-center spacing $r_1$ is not constant for the portion of the trace pair being evaluated, as for example shown in FIG. 1, then Equation (C) is evaluated with $r_1$ equal to the minimum center-to-center spacing of that portion; $l_c$ is then the length that the portion would have if actually separated by $r_1$ along its entire lengths, as shown in FIG. 1.

The variable $T_D$ in Equation (C) is defined by Equation (B). The variable $t_r$ represents the smallest rise time for the trace pair(s) being evaluated. For a trace pair maximum data rate of 100 Mbs/sec, for example, $t_r$ equals about 2 ns.

Equation (3) sets forth the third of the tests for evaluating whether a specified trace configuration has balanced interconnections. Equation (3) is intended to assume that the near-end crosstalk voltage ratio (NEXT) of the trace pair, expressed as a function of the size of the trace cross sections and certain dimensions of the trace pair configuration, is no greater than a predetermined value represented by the variable $B_2B_1$. In the embodiment illustrated in FIGS. 1 and 2, $B_2B_1$ preferably equals approximately 0.01.

Equation (3) is:

$$\frac{\ln\left[\frac{1+(r_0/\Delta)^2}{1+(r_0/(d+\Delta))^2}\right]}{4\ln\left[\frac{9(d/p)}{[1+(d/r_0)^2]^{1/2}}\right]} \leq B_2B_1 \qquad \text{Eq. 3}$$

Equation (3) assumes a trace configuration in which the traces—e.g. 27c, 27c' and 27b, 27b'—are vertically aligned across the width or thickness of the substrate, as shown in FIGS. 3 and 4. Such an assumption does not negatively affect the accuracy of Equation (3) for determining whether a configuration in which the traces are not vertically aligned has balanced interconnections since crosstalk is ordinarily higher in traces that are so aligned then where they are staggered. Thus, if Equation (3) indicates that a specified trace configuration has balanced interconnections when the traces are assumed to be vertically aligned, then Equation (3) will likewise be satisfied if the traces carried on opposite sides of the substrate 14 are in fact positionally staggered.

It should be understood that the connector assembly 10 may include the capacitive means 25 and/or balanced interconnections as described hereinabove for reducing crosstalk in the connector assembly, all with such embodiments and variations being within the intended scope and contemplation of the invention. It is most preferred, however, that the inventive connector assembly 10 include both the capacitive means 25 and balanced interconnections so as to yield the largest reduction in crosstalk in the connector assembly.

Thus, while there have been shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same result are within the scope of the invention. It is the intention, therefore, to be limited only as indicated by the scope of the claims appended hereto.

What is claimed is:

1. A modular electrical connector assembly to which an electrical telecommunication cable having an impedance value is connectable for communicating electrical signals at a rate of 100 Mb/s between said connector assembly and the cable, said connector assembly comprising:

an electrically nonconductive body having a surface;

a crosstalk energy emitting electrical interference source including a conductor on said body and a modular jack connected to said body;

an electrically conductive balanced transmission line containing first and second leads disposed on said surface and in spaced relation to one another on said body, said first and second leads having an impedance value substantially equal to the impedance value of said electrical telecommunication cable and defining an electrical signal circuit for carrying electrical signals communicatable with the cable, said first lead being located more closely proximate to said conductor than is said second lead such that a greater amount of crosstalk energy from said conductor is electromagnetically impressed on said first lead than on said second lead to thereby define a difference in the crosstalk energy electromagnetically impressed on said first and second leads; and capacitive connecting means located closely adjacent to said modular jack for connecting said conductor to said second lead for transferring, through said capacitive connecting means, crosstalk energy between said interference source and said second lead in an amount sufficient to substantially equalize the crosstalk energy on said first and second leads and thereby substantially eliminate said difference in the electromagnetically-impressed crosstalk energy on said first and second leads.

2. A modular electrical connector assembly in accordance with claim 1, wherein said capacitive connecting means comprises a capacitor connected between said interference source and said second lead.

3. A modular electrical connector assembly in accordance with claim 2, wherein said capacitor comprises a parasitic capacitor having a capacitance of no greater than approximately 1.7 pF.

4. A modular electrical connector assembly in accordance with claim 1, wherein said body comprises a substrate, and wherein each of said first and second leads comprises a printed circuit trace on said substrate.

5. A modular electrical connector assembly in accordance with claim 4, wherein said interference source comprises a conductive printed circuit trace on said substrate in a predeterminately-fixed position on said substrate relative to each of said first and second lead traces.

6. A printed wiring board for a modular electrical connector assembly including a modular jack, which contributes to the generation of crosstalk energy, to which an electrical telecommunication cable having an impedance value is connectable for communicating electrical signals at a rate of 100 Mb/s between said connector assembly and the cable, said printed wiring board comprising:

an electrically nonconductive substrate having a surface;

a crosstalk energy emitting electrical interference source including a conductor on said substrate;

an electrically conductive balanced transmission line containing first and second traces disposed on said substrate surface, said balanced transmission line having an impedance value substantially equal to the impedance value of said electrical telecommunication cable and in spaced relation to one another on said substrate, said first and second traces defining a first electrical signal circuit for carrying electrical signals communicatable with the cable, said first trace being located more closely proximate to said conductor than said second trace, such that a greater amount of crosstalk energy from said conductor is electromagnetically impressed on said first trace than on said second trace to thereby define a difference in the crosstalk energy electromagnetically impressed on said first and second traces; and capacitive connecting means located closely adjacent to the modular jack for connecting said conductor to said second conductive trace for transferring crosstalk energy, through said capacitive connecting means, between said conductor and said second trace in an amount sufficient to substantially equalize the crosstalk energy generated by said conductor and the modular jack on said first and second traces and thereby substantially eliminate said difference in the crosstalk energy electromagnetically-impressed on said first and second traces.

7. A printed wiring board in accordance with claim 6, wherein said interference source comprises an electrically conductive interference trace on said substrate, and wherein said capacitive connecting means comprises a capacitor connected between said interference trace and said second trace.

8. A printed wiring board in accordance with claim 6, wherein said interference source comprises third and fourth electrically conductive traces in spaced relation to one another on said substrate and defining a second electrical signal circuit for carrying electrical signals communicatable with the cable and electromagnetically emitting crosstalk energy as electrical signals are carried by said third and fourth traces, said third trace being located more closely proximate to said first trace than to said second trace such that a greater amount of crosstalk energy from said third trace is electromagnetically impressed on said first trace than on said second trace, and said fourth trace being located more closely proximate to said second trace than to said first trace such that a greater amount of crosstalk energy from said fourth trace is electromagnetically impressed on said second trace than on said first trace, said capacitive connecting means capacitively connecting said first trace to said fourth trace and said second trace to said third trace for passing crosstalk energy through said capacitive connecting means so as to substantially eliminate differences in the amounts of crosstalk energy electromagnetically-impressed on said first and second traces by said third and fourth traces.

9. A printed wiring board in accordance with claim 8, further comprising fifth and sixth electrically conductive traces disposed in spaced relation to one another on said substrate, said fifth and sixth traces defining a third electrical signal circuit for carrying electrical signals communicatable with the cable, said fifth trace being located more closely proximate to said fourth trace than is said sixth trace so that said fourth trace electromagnetically impresses a greater amount of said crosstalk energy on said fifth trace than on said sixth trace, and said capacitive connecting means further capacitively connecting said fourth trace to said sixth trace for passing crosstalk energy through said capacitive connecting means so as to substantially eliminate differences in the amounts of crosstalk energy electromagnetically-impressed on said fifth and sixth traces by said fourth trace.

10. A printed wiring board in accordance with claim 6, wherein said substrate has a dielectric constant $\epsilon_r$ and said substrate surface being a generally flat primary surface on which said first and second traces are disposed in substantially parallel relation and spaced apart by an edge-to-edge spacing $s_0$, said first and second traces having a nominal impedance $Z_B$ and a substantially rectangular cross section of width W and of thickness $t_0$, and said first and second traces being predeterminately located on said substrate primary surface so as to provide balanced interconnections in accordance with:

$$0.9Z_B \leq \frac{120}{1.016\sqrt{\epsilon_r}} \ln\left[\frac{2e^{3/2}d}{p[1+(d/r_0)^2]^{1/2}}\right] \leq 1.1Z_B$$

wherein $p = 2(W + t_0)$;

$r_0 = W + s_0$; and $d = 40$.

11. A printed wiring board in accordance with claim 6, wherein said substrate has a dielectric constant $\epsilon_r$ and said substrate surface being a generally flat primary surface on which said first and second traces are disposed in substantially parallel relation and spaced apart by an edge-to-edge spacing $s_0$, said first and second traces having a nominal impedance $Z_B$ and a substantially circular cross section of width W and of radius $\rho$, and said first and second traces being predeterminately located on said substrate primary surface so as to provide balanced interconnections in accordance with:

$$0.9Z_B \leq \frac{120}{1.016\sqrt{\epsilon_r}} \ln\left[\frac{2e^{3/2}d}{p[1+(d/r_0)^2]^{1/2}}\right] \leq 1.1Z_B$$

wherein $p = 2\rho e^{[5/4]}$;

$r_0 = 2\rho + s_0$; and $d = 40$.

12. A printed wiring board in accordance with claim 6, wherein said substrate surface being a generally flat primary surface on which said first and second traces are disposed in generally parallel relation and spaced apart by an edge-to-edge spacing $s_0$, said printed wiring board further comprising electrically conductive third and fourth traces disposed on said primary surface in substantially parallel relation to one another and to said first and second traces and defining a second electrical signal circuit for carrying electrical signals communicatable with the cable, said third and fourth traces being spaced apart by said edge-to-edge spacing $s_0$ and said first trace being spaced from said third trace by a center-to-center spacing $r_1$, and each of said first, second, third and fourth traces having a substantially rectangular cross section of thickness $t_0$ and of width W, said first, second, third and fourth traces being predeterminately located on said substrate and relative to one another so as to provide balanced interconnections with a maximum allowable near-end crosstalk voltage ratio BB in accordance with:

$$\frac{\ln\left(\frac{[1+[d/(r_1+r_0)]^2][1+[d/(r_1-r_0)]^2]}{[1+(d/r_1)^2]^2}\right)}{8\ln[9(d/p)/[1+(d/r_0)^2]^{1/2}]} \leq BB$$

wherein $p = 2(W+t_0)$;

$r_0 = W + s_0$; and $d = 40$.

13. A printed wiring board in accordance with claim 6, wherein said substrate surface being a generally flat primary surface on which said first and second traces are disposed in generally parallel relation and spaced apart by an edge-to-edge spacing $s_0$, said printed wiring board further comprising electrically conductive third and fourth traces disposed on said primary surface in substantially parallel relation to one another and to said first and second traces and defining a second electrical signal circuit for carrying electrical signals communicatable with the cable, said third and fourth traces being spaced apart by said edge-to-edge spacing $s_0$ and said first trace being spaced from said third trace by a center-to-center spacing $r_1$, and each of said first, second, third and fourth traces having a substantially circular cross section of thickness $t_0$ and of radius $\rho$, said first, second, third and fourth traces being predeterminately located on said substrate and relative to one another so as to provide balanced interconnections with a maximum allowable near-end crosstalk voltage ratio BB in accordance with:

$$\frac{\ln\left(\frac{[1+[d/(r_1+r_0)]^2][1+[d/(r_1-r_0)]^2]}{[1+(d/r_1)^2]^2}\right)}{8\ln[9(d/p)/[1+(d/r_0)^2]^{1/2}]} \leq BB$$

wherein $p = 2\rho e^{[5/4]}$;

$r_0 = 2\rho + s_0$; and $d = 40$.

14. A printed wiring board in accordance with claim 6, wherein said substrate surface being a generally flat primary surface on one face of said substrate and on which said first and second traces are disposed in generally parallel relation to one another, and a generally flat secondary surface on an opposite face of said substrate and lying substantially parallel to said primary surface to define a substrate thickness T between said primary and secondary surfaces, said printed wiring board further comprising electrically conductive third and fourth traces disposed on said secondary surface in substantially parallel relation to one another and defining a second electrical signal circuit for carrying electrical signals communicatable with the cable, said third and fourth traces being spaced apart by said edge-to-edge spacing $s_0$, each of said first, second, third and fourth traces having a substantially rectangular cross section of thickness $t_0$ and of width W, and said first, second, third and fourth traces being predeterminately located on said substrate and relative to one another so as to provide balanced interconnections with a maximum allowable near-end crosstalk voltage ratio $B_2 B_1$ in accordance with:

$$\frac{\ln\left[\frac{1+(r_0/\Delta)^2}{1+(r_0/(d+\Delta))^2}\right]}{4\ln\left[\frac{9(d/p)}{[1+(d/r_0)^2]^{1/2}}\right]} \leq B_2 B_1$$

wherein $p = 2(W+t_0)$;

$r_0 = W + s_0$;

$d = 40$; and $\Delta = T + t_0$.

15. A printed wiring board in accordance with claim 6, wherein said substrate surface being a generally flat primary surface on one face of said substrate and on which said first and second traces are disposed in generally parallel relation to one another, and a generally flat secondary surface on an opposite face of said substrate and lying substantially parallel to said primary surface to define a substrate thickness T between said primary and secondary surfaces, said printed wiring board further comprising electrically conductive third and fourth traces disposed on said secondary surface in substantially parallel relation to one another and defining a second electrical signal circuit for carrying electrical signals communicatable with the cable, said third and fourth traces being spaced apart by said edge-to-edge spacing $s_0$, each of said first, second, third and fourth traces having a substantially circular cross section of thickness $t_0$ and of radius $\rho$, and said first, second, third and fourth traces being predeterminately located on said substrate and relative to one another so as to provide balanced interconnections with a maximum allowable near-end crosstalk voltage ratio $B_2 B_1$ in accordance with:

$$\frac{\ln\left[\frac{1+(r_0/\Delta)^2}{1+(r_0/(d+\Delta))^2}\right]}{4\ln\left[\frac{9(d/p)}{[1+(d/r_0)^2]^{1/2}}\right]} \leqq B_2B_1$$

wherein $p=2\rho e^{[5/4]}$;

$r_0=2\rho+s_0$;

$d=40$; and $\Delta=T+2\rho$.

* * * * *